United States Patent
Shibata et al.

(10) Patent No.: US 11,304,305 B2
(45) Date of Patent: Apr. 12, 2022

(54) RESIN FILM, AND LAMINATED FILM INCLUDING BASE MATERIAL FILM, RESIN FILM FORMED ON BASE MATERIAL FILM, AND PROTECTIVE FILM ATTACHED TO RESIN FILM

(71) Applicant: HITACHI CHEMICAL COMPANY, LTD., Tokyo (JP)

(72) Inventors: Tomoaki Shibata, Tokyo (JP); Hanako Yori, Tokyo (JP); Tomonori Minegishi, Tokyo (JP); Hidenori Abe, Tokyo (JP); Takashi Masuko, Tokyo (JP); Shunsuke Otake, Tokyo (JP)

(73) Assignee: SHOWA DENKO MATERIALS CO., LTD, Tokyo (JP)

( * ) Notice: Subject to any disclaimer, the term of this patent is extended or adjusted under 35 U.S.C. 154(b) by 286 days.

(21) Appl. No.: 16/854,310

(22) Filed: Apr. 21, 2020

(65) Prior Publication Data

US 2020/0253059 A1    Aug. 6, 2020

Related U.S. Application Data

(63) Continuation of application No. 15/527,644, filed as application No. PCT/JP2015/082123 on Nov. 16, 2015, now Pat. No. 10,674,612.

(30) Foreign Application Priority Data

| Nov. 18, 2014 | (JP) | 2014-233699 |
| Jan. 28, 2015 | (JP) | 2015-014511 |
| May 7, 2015 | (JP) | 2015-094942 |
| Oct. 20, 2015 | (JP) | 2015-206365 |
| Oct. 20, 2015 | (JP) | 2015-206367 |

(51) Int. Cl.

| H01L 21/56 | (2006.01) |
| H05K 3/28 | (2006.01) |
| G01P 1/12 | (2006.01) |
| H05K 1/03 | (2006.01) |
| H01L 25/18 | (2006.01) |
| H01L 23/31 | (2006.01) |
| H05K 3/00 | (2006.01) |
| H05K 1/18 | (2006.01) |

(52) U.S. Cl.
CPC ............ *H05K 3/284* (2013.01); *G01P 1/127* (2013.01); *H01L 21/56* (2013.01); *H05K 1/0393* (2013.01); *H05K 3/28* (2013.01); *H01L 21/561* (2013.01); *H01L 23/3121* (2013.01); *H01L 25/18* (2013.01); *H01L 2924/0002* (2013.01); *H01L 2924/12041* (2013.01); *H01L 2924/1421* (2013.01); *H01L 2924/1434* (2013.01); *H05K 1/189* (2013.01); *H05K 3/0052* (2013.01); *H05K 2201/0108* (2013.01); *H05K 2201/0129* (2013.01); *H05K 2201/0133* (2013.01); *H05K 2201/0154* (2013.01); *H05K 2201/0158* (2013.01); *H05K 2201/0162* (2013.01); *H05K 2201/10098* (2013.01); *H05K 2201/10151* (2013.01); *Y10T 29/4913* (2015.01)

(58) Field of Classification Search
CPC ........................................................ C08L 53/025
See application file for complete search history.

(56) References Cited

U.S. PATENT DOCUMENTS

| 5,085,697 A | 2/1992 | Kimura |
| 6,414,059 B1* | 7/2002 | Kobayashi .............. C08L 23/04 523/212 |
| 8,034,667 B2 | 10/2011 | Shinoda et al. |
| 2002/0091174 A1 | 7/2002 | Soane |
| 2008/0105454 A1 | 5/2008 | Morioka |
| 2008/0185705 A1 | 8/2008 | Osborn |
| 2009/0067798 A1* | 3/2009 | Hikita .................. G02B 6/1221 385/131 |
| 2009/0189516 A1 | 7/2009 | Kurata et al. |
| 2010/0304104 A1* | 12/2010 | Nagasaki ............... B32B 5/022 428/213 |
| 2012/0205136 A1 | 8/2012 | Moriuchi |
| 2013/0264724 A1 | 10/2013 | Teigenbuscher |
| 2014/0102935 A1 | 4/2014 | Jayasuriya |
| 2014/0262430 A1 | 9/2014 | Yamada |
| 2015/0241770 A1 | 8/2015 | Yoshida |
| 2015/0322296 A1 | 11/2015 | Keite-Telgenbuscher |
| 2016/0108287 A1 | 4/2016 | Schumann |
| 2016/0136942 A1 | 5/2016 | Stebani |
| 2017/0325336 A1* | 11/2017 | Shibata .................. H05K 3/284 |
| 2018/0288882 A1* | 10/2018 | Shibata .................... H05K 3/28 |

FOREIGN PATENT DOCUMENTS

| CN | 1643070 A | 7/2005 |
| DE | 102008022977 A1 | 4/2009 |
| JP | H04-34958 A | 2/1992 |
| JP | 5-229293 H | 9/1993 |
| JP | H08-23156 A | 1/1996 |
| JP | 2004-051935 A | 2/2004 |
| JP | 2007-142247 A | 6/2007 |
| JP | 8145886 A | 10/2008 |
| JP | 2012-134272 A | 7/2012 |
| WO | 2012/090356 A1 | 7/2012 |

OTHER PUBLICATIONS

International Search Report of Appln. No. PCT/JP2015/082123 dated Jan. 26, 2016 in English.
International Preliminary Report of Appln. No. PCT/JP2015/082123 dated May 23, 2017.

* cited by examiner

*Primary Examiner* — Jeffrey C Mullis
(74) *Attorney, Agent, or Firm* — Fitch, Even, Tabin & Flannery, L.L.P.

(57) ABSTRACT

A resin film includes a resin composition for forming a flexible resin layer. The resin composition includes an elastomer, a polymerizable compound, and a polymerization initiator. A laminated film includes a base material film, a resin film formed on the base material film, and a protective film attached to the resin film.

7 Claims, 4 Drawing Sheets

RESIN FILM, AND LAMINATED FILM INCLUDING BASE MATERIAL FILM, RESIN FILM FORMED ON BASE MATERIAL FILM, AND PROTECTIVE FILM ATTACHED TO RESIN FILM

CROSS-REFERENCE TO RELATED APPLICATIONS

This application is a continuation of U.S. application Ser. No. 15/527,644, filed in the U.S. on Jun. 17, 2017, which is a U.S. national phase application filed under 35 U.S.C. § 371 of International Application No. PCT/JP2015/082123, filed Nov. 16, 2015, which claims priority from Japanese patent application 2015-206367, filed Oct. 20, 2015, Japanese patent application 2015-206365, filed Oct. 20, 2015, Japanese patent application 2015-094942, filed May 7, 2015, Japanese patent application 2015-014511, filed Jan. 28, 2015, and Japanese patent application 2014-233699, filed Nov. 18, 2014, the entire contents of each of which are hereby incorporated herein by reference.

TECHNICAL FIELD

The present invention relates to a semiconductor device and a method for producing the same. The present invention also relates to a resin composition and a resin film that are used for forming a flexible resin layer, and a semiconductor device produced using these.

BACKGROUND ART

In recent years, wearable devices are required to have flexibility and elasticity, so that, in addition to the demand for size reduction, the wearable devices can be used in a state of being disposed along a curved surface such as the body so as to facilitate wearing of the devices on the body, and also, connection failure does not easily occur even when the devices are taken off.

Patent Literature 1 discloses a method for obtaining an in-mold article having a built-in electronic component part using a printed wiring board having components such as IC mounted thereon, and a long fiber-reinforced resin. This method enables miniaturization by building a plurality of modules with built-in components in a resin. Furthermore, a wearable device used for a curved surface, the device being composed of hard parts and flexible parts in mixture, has also been developed. Described in Patent Literature 2 is a method for obtaining a flexible module with built-in components, by forming a concavity on a flexible substrate, and encapsulating an electronic component mounted inside the concavity using a long fiber-reinforced resin.

CITATION LIST

Patent Literature

Patent Literature 1: Japanese Unexamined Patent Publication No. H5-229293
Patent Literature 2: Japanese Unexamined Patent Publication No. 2012-134272

SUMMARY OF INVENTION

Technical Problem

In a case of obtaining an in-mold article having electronic component parts built therein using a long fiber-reinforced resin, it is possible to miniaturize an electronic device, but it is difficult to use an electronic device to be disposed along a curved surface, since it is difficult to bend the electronic components. Furthermore, since a resin product produced using a long fiber-reinforced resin has poor transparency, it is disadvantageous for applications where transparency is required. In the case of an electronic device having hard parts and flexible parts in mixture, since the proportion occupied by the hard parts tends to be larger, there are limitations on the curved surface that can be used, and also, there is a risk that connection failure may occur if wearing and taking off is repeated. Furthermore, in the method of having electronic components built-in by forming concavities on a flexible substrate, there is a problem that the number of production processes increases because it is necessary to form concavities.

According to an aspect, an object of the present invention is to provide a method to enable efficient acquisition of a semiconductor device having sufficient flexibility that can be used along a curved surface and may not easily have connection failure even if the semiconductor device is taken off, and to provide a semiconductor device obtainable by the method.

According to another aspect, a main object of the present invention is to provide a resin composition which is capable of forming a flexible resin layer having excellent flexibility and transparency, with satisfactory level difference embedding properties.

Solution to Problem

According to an aspect of the present disclosure, there is provided a method for producing a semiconductor including a circuit board composed of a flexible substrate, a circuit component mounted on the flexible substrate, and a flexible resin layer (flexible member) encapsulating the circuit components. This method includes a step of laminating an encapsulant (encapsulating member) on the flexible substrate, and thereby encapsulating the circuit components with the encapsulant; and a step of curing the encapsulant, and thereby forming the flexible resin layer (flexible member).

A method according to another aspect of the present disclosure includes a step of printing an encapsulant (encapsulating member) on the flexible substrate, and thereby encapsulating the circuit component with the encapsulant; and a step of curing the encapsulant, and thereby obtaining the circuit board having the flexible resin layer (flexible member).

A method according to another aspect of the present disclosure includes a step of immersing the flexible substrate in an encapsulant (encapsulating member), drying the flexible substrate, and thereby encapsulating the circuit component with the encapsulating member; and a step of curing the encapsulant, and thereby obtaining the circuit board having the flexible member.

In regard to these methods, the encapsulant can be cured by heating and/or exposure to light.

Since the semiconductor device obtainable by the method according to the present disclosure uses a flexible substrate and a flexible resin layer (flexible member), the semiconductor device can have flexibility that enables the semiconductor device to be used in a state of being installed along a curved surface (for example, can be worn on a curved surface such as the body) and does not easily cause connection failure even when the device is taken off. According to the method related to the present disclosure, such semiconductor device can be efficiently obtained, and for example, a semiconductor device can be obtained with a smaller number of production processes. Furthermore, according to the methods related to some embodiments, in a case in which a plurality of circuit components are used, an electronic component can be miniaturized by encapsulating a plurality of circuit components with a flexible resin layer (flexible member).

The method for producing a semiconductor device according to the present disclosure may further include a step of cutting the circuit substrate. When this step is carried out, a plurality of semiconductor devices can be produced in a large area all at once, and the number of production processes can be further decreased.

The flexible resin layer (flexible member) may contain at least one selected from the group consisting of a polyimide resin, an acrylic resin, a silicone resin, a urethane resin, an epoxy resin, and a polyethylene glycol resin.

The flexible substrate and the flexible resin layer may be transparent in the visible light region. When the flexible substrate and the flexible resin layer are transparent in the visible light region, a semiconductor device that does not significantly impair the design characteristics of the device to which the semiconductor device is applied can be obtained. For example, a problem that in a device using a transparent housing, particularly the substrate surface is entirely revealed so that design characteristics are significantly impaired, can be avoided. Regarding electronic components that are used in wearable devices, it is desirable that a device to which such electronic components are applied fits naturally into the body and the surroundings even when the device is worn on the body. Therefore, there is a demand for electronic components that do not impair the construction and design of a device itself.

Two or more kinds of the circuit components may be provided. When a circuit board is allowed to have various functions by employing two or more kinds of circuit components in the circuit board, miniaturization of the electronic components is facilitated.

The inventors of the present invention repeatedly conducted thorough investigations, and as a result, the inventors found that when a resin composition including (A) an elastomer containing at least any one of a thermoplastic polyurethane or a styrene-based elastomer; (B) a polymerizable compound; and (C) a polymerization initiator, and a resin film produced therefrom are used, the problem related to level difference embedding properties can be solved. That is, according to another aspect of the present invention, there are provided such a resin composition, a resin film, and a semiconductor device having a flexible resin layer produced using these resin composition and resin film.

Advantageous Effects of Invention

According to the present invention, a method for producing a semiconductor, by which it is possible to efficiently obtain a semiconductor device having flexibility that enables the semiconductor device to be used along a curved surface and does not easily cause connection failure even when the device is taken off, and having electronic components made transparent as far as possible so that the design characteristics of a device to which the electronic components are applied are not significantly impaired, and a semiconductor device obtainable by this production method, can be provided. Semiconductor devices obtainable by the methods according to some embodiments can have excellent elasticity.

The resin composition and the resin film of the present invention have excellent flexibility, and can form a highly transparent flexible resin layer with satisfactory level difference embedding properties.

DESCRIPTION OF EMBODIMENTS

Figure 1:
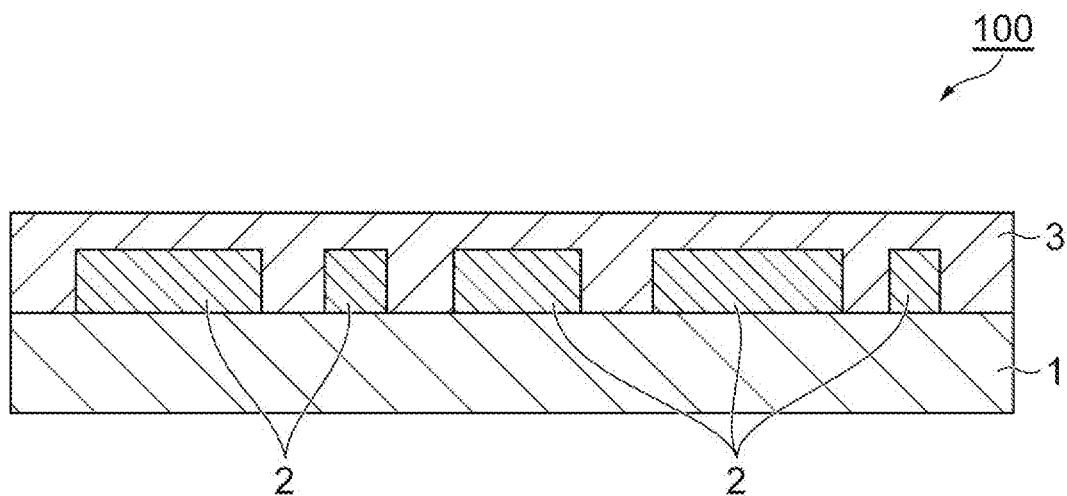
FIG. 1 is a cross-sectional view schematically illustrating an embodiment of a semiconductor device.

Hereinafter, embodiments of the present invention will be described in detail, optionally with reference to the drawings. However, the present invention is not intended to be limited to the following embodiments. Identical or equivalent parts in the drawings will be assigned with the same reference numeral, and any overlapping descriptions will not be repeated. Unless particularly stated otherwise, the positional relations such as a vertical position or a horizontal position will be based on the positional relations illustrated in the drawings. The dimensional ratios of the drawings are not limited to the ratios of illustration.

Semiconductor Device

FIG. 1 is a cross-sectional view schematically illustrating a semiconductor device according to the present embodiment. The semiconductor device 10 according to the present embodiment includes a circuit board composed of a flexible substrate 1 having flexibility; circuit components 2; and a flexible resin layer having flexibility (also referred to as flexible layer or flexible member) 3. The flexible substrate 1 may be transparent in the visible light region. The flexible substrate 1 is, for example, a flexible substrate that may be transparent in the visible light region. The circuit components 2 are mounted on the flexible substrate 1. The flexible resin layer 3 encapsulates the flexible substrate 1 and the circuit components 2, and protects the surface of the circuit board.

Here, when it is said that a material is transparent in the visible light region, it means that when the thickness of a material is normalized to 50 μm, the light transmittance at a wavelength of 400 nm to 750 nm in the visible light region is 90% or higher. In regard to an encapsulant having curability, when it is said that the encapsulant is transparent in the visible light region, it means that the light transmittance is satisfied in a state in which the encapsulant has been cured.

Regarding the constituent material for a flexible substrate 1 that may be transparent in the visible light region, a polyimide resin, an acrylic resin, a silicone resin, a urethane resin, an epoxy resin, a polyethylene glycol resin, and the like are used according to the purpose. These can be materials that are transparent in the visible light region. From the viewpoint of having superior elasticity, the constituent material of the flexible substrate 1 may be at least one selected from the group consisting of a polyimide resin having a siloxane structure, an aliphatic ether structure or a diene structure, an acrylic resin, a silicone resin, a urethane resin, a bismaleimide resin having a long alkyl chain (for example, an alkyl chain having 1 to 20 carbon atoms), an epoxy resin, and a polyethylene glycol resin having a rotaxane structure. The constituent material may also be at least one selected from the group consisting of a polyimide resin having a siloxane structure, an aliphatic ether structure or a diene structure, a silicone resin, a urethane resin, and a bismaleimide resin having a long alkyl chain. These may be used singly, or two or more kinds thereof can be used in combination. In a case in which the flexible substrate 1 has a wiring part, it is not necessarily essential for the conductive material of the wiring part to be transparent in the visible light region.

The constituent material of the flexible substrate 1 may be at least one selected from the group consisting of a polyimide resin, an acrylic resin, a silicone resin, a urethane resin, a bismaleimide resin, an epoxy resin, and a polyethylene glycol resin. Among these, from the viewpoint of having superior elasticity, the constituent material of the flexible substrate 1 may be at least one selected from the group consisting of a polyimide resin having a siloxane structure, an aliphatic ether structure or a diene structure, an acrylic resin, a silicone resin, a urethane resin, a bismaleimide resin having a long alkyl chain (for example, an alkyl chain having 1 to 20 carbon atoms), an epoxy resin, and a polyethylene glycol resin having a rotaxane structure. From the viewpoint of having superior elasticity, the constituent material of the flexible substrate 1 may be at least one selected from the group consisting of a polyimide resin having a siloxane structure, an aliphatic ether structure or a diene structure, a silicone resin, a urethane resin, and a bismaleimide resin having a long alkyl chain. The constituent materials of the flexible substrate 1 may be used singly, or two or more kinds thereof may be used in combination.

The circuit components 2 include, for example, surface mounted components including semiconductor elements, such as a memory chip, a light emitting diode (LED), an RF tag (RFID), a temperature sensor, and an acceleration sensor. A single kind of circuit components 2 may be mounted, or two or more kinds of circuit components 2 may be mounted in co-presence. One circuit component 2 may be mounted, or a plurality of circuit components 2 may be mounted.

The flexible resin layer 3 is, for example, a resin cured product layer, and is obtained by curing an encapsulant. The flexible resin layer 3 can be formed, for example, using the resin composition that will be described below or a resin film produced therefrom as an encapsulant, and curing these.

Alternatively, regarding the constituent material for the flexible resin layer (flexible layer) 3 and the encapsulant that forms the flexible resin layer 3, for example, a polyimide resin, an acrylic resin, a silicone resin, a urethane resin, an epoxy resin, and a polyethylene glycol resin can be used according to the purpose. These materials can be materials that are transparent in the visible light region. From the viewpoint of having superior elasticity, the constituent material for the flexible resin layer 3 may be at least one selected from a polyimide resin having a siloxane structure, an aliphatic ether structure or a diene structure, an acrylic resin, a silicone resin, a urethane resin, a bismaleimide resin having a long alkyl chain (for example, an alkyl chain having 1 to 20 carbon atoms), an epoxy resin, and a polyethylene glycol resin having a rotaxane structure. The constituent material may also be at least one selected from the group consisting of a polyimide resin having a siloxane structure, an aliphatic ether structure or a diene structure, a silicone resin, a urethane resin, and a bismaleimide resin having a long alkyl chain. These can be used singly or in combination of two or more kinds thereof.

Examples of the shape of the encapsulant that forms the flexible resin layer 3 include a film form and a liquid form. From the viewpoint of obtaining excellent handleability at the time of embedding for encapsulation and obtaining excellent flatness of the flexible resin layer that is formed while embedding level differences, the encapsulant may be in a film form.

The flexible resin layer 3 after being cured may exhibit a low elastic modulus and high elongation characteristics, and may also have high bending resistance. Thereby, flexibility is further improved, and therefore, flexibility that enables the semiconductor device to be used along a curved surface and also does not easily cause connection failure even when the semiconductor device is taken off, can be more easily obtained. It is desirable that the flexible resin layer 3 has excellent water resistance and sweat resistance, from the viewpoint of being easily wearable on the body.

Method for Producing Semiconductor Device

The method for producing a semiconductor device according to the present embodiment includes, for example, a mounting step, an encapsulation step, a curing step, and a cutting step in this order.

Step 1: Mounting Step

Figure 2:
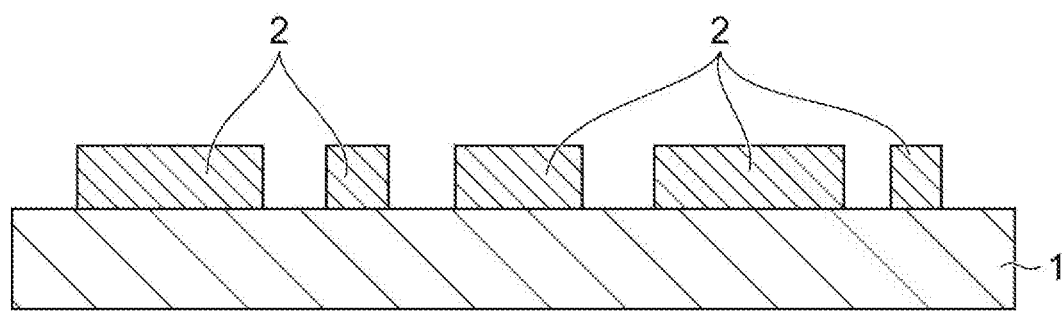
FIG. 2 is a cross-sectional view schematically illustrating an embodiment of a flexible substrate and circuit components.

First, as illustrated in FIG. 2, circuit components 2 are mounted on a flexible substrate 1. A plurality of circuit components 2 to be mounted may be of a single kind or may be a combination of two or more kinds. The number of the circuit components 2 to be mounted may be one or a plurality.

Step 2: Encapsulation Step

Next, the flexible substrate 1 and the circuit components 2 are encapsulated with a resin composition or a resin film as an encapsulant. The flexible substrate 1 and the circuit components 2 can be encapsulated by laminating a film-shaped encapsulant (resin film) on the flexible substrate 1, printing an encapsulant (resin composition) on the flexible substrate 1, or immersing the flexible substrate 1 in an encapsulant (resin composition) and drying the encapsulant. Encapsulation can be implemented by hot pressing, roll laminating, vacuum laminating, printing, dipping, or the like. Among these, a method that can be used in a roll-to-roll process can shorten the production process.

In an encapsulation process based on hot pressing, roll laminating, vacuum laminating or the like, it is preferable that an encapsulant (resin film) is laminated under reduced pressure. The pressing pressure for lamination may be about 0.1 to 150 MPa (about 1 to 1500 kgf/cm$^2$). For encapsulation, the encapsulant (encapsulating resin) may be heated to 50° C. to 170° C. There are no particular limitations on these conditions.

Step 3: Curing Step

After the flexible substrate 1 and the circuit components 2 are encapsulated with an encapsulant in the encapsulation step, the encapsulant is cured, and thereby a flexible resin layer 3 is formed. Thus, a circuit board having a flexible resin layer 3 is obtained. Thereby, the semiconductor device 100 illustrated in FIG. 1 is obtained. The encapsulant can be cured by thermal curing based on heating, photocuring based on exposure to light, or a combination thereof. Regarding the encapsulant, from the viewpoint of heat resistance of the circuit component 2, if the encapsulant is thermally curable, the encapsulant may be a material (resin composition) that is cured at low temperature. The encapsulant may also be a photocurable material (resin composition), from the viewpoint that the encapsulant can be cured at room temperature.

Step 4: Cutting Step

Figure 3:
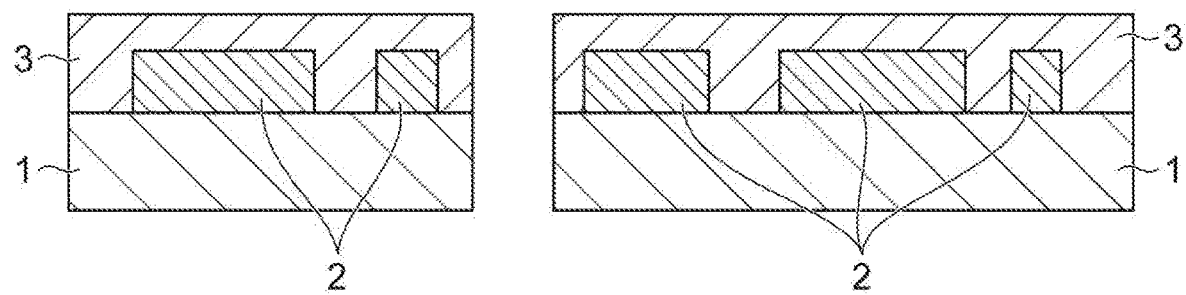
FIG. 3 is a cross-sectional view schematically illustrating an embodiment of a process for obtaining a plurality of semiconductor devices.

The method for producing a semiconductor device may include, if necessary, for example, as illustrated in FIG. 3, a step of cutting and separating circuit boards and thereby obtaining a plurality of semiconductor devices having circuit components. Thereby, a plurality of semiconductor devices can be produced in a large area all at once, and the number of production processes can be reduced easily.

Resin Composition for Forming Flexible Resin Layer

A resin composition according to an embodiment includes: (A) an elastomer containing at least one of a thermoplastic polyurethane or a styrene-based elastomer; (B) a polymerizable compound; and (C) a polymerization initiator, and the resin composition is used for forming a flexible resin layer. This resin composition can be cured by irradiating the resin composition with active light rays, and/or by heating.

As the thermoplastic polyurethane, a product that is generally used as an elastomer or a thermoplastic elastomer can be used. Examples of a commercially available product of thermoplastic polyurethane include "ELASTON series" of BASF Japan, Ltd.; "MIRACTRAN series" of Tosoh Corp.; "PANDEX series", "DESMOPAN series", and "TEXIN series" of DIC Bayer Polymer, Ltd.

The thermoplastic polyurethane may be a polyether-based thermoplastic polyurethane, which is a reaction product of a polyether diol and a diisocyanate, from the viewpoint of water resistance. Examples of a commercially available product of a polyether-based thermoplastic polyurethane include "ELASTON ET385" of BASF Japan, Ltd. From the viewpoints of transparency and weather resistance, a so-called non-yellowing type thermoplastic polyurethane may also be used. Examples of a commercially available product of a non-yellowing type thermoplastic polyurethane include "MIRACTRAN XN-2001" of Tosoh Corp., which is a reaction product of hexamethylene diisocyanate and a polycarbonate diol.

The weight average molecular weight of the thermoplastic polyurethane may be 10,000 to 200,000, 20,000 to 175,000, or 30,000 to 150,000, from the viewpoint of coating film characteristics. According to the present specification, the weight average molecular weight (Mw) may be a value measured by gel permeation chromatography (GPC) and calculated relative to polystyrene standards.

A styrene-based elastomer is an elastomer having, as basic unit structures, polystyrene as a hard segment, and a copolymer including a diene-based elastomer containing unsaturated double bonds, which is selected from polyethylene, polybutylene, polyisoprene and the like, as a soft segment.

Examples of a commercially available product of the styrene-based elastomer include "DYNARON SEBS series" of JSR Corp.; "KRATON D Polymer series" of Kraton Polymers Japan, Ltd.; and "AR series" of Aronkasei Co., Ltd.

A hydrogenated styrene-based elastomer is produced by subjecting the unsaturated double bonds of a diene-based elastomer as a soft segment to an addition reaction with hydrogen. When a hydrogenated styrene-based elastomer is used, effects of enhancing weather resistance and the like can be expected.

Examples of a commercially available product of the hydrogenated styrene-based elastomer include "DYNARON HSBR series" of JSR Corp.; "KRATON G Polymer series" of Kraton Polymers Japan, Ltd.; and "TUFTEC series" of Asahi Kasei Chemicals Corp.

The weight average molecular weight of the styrene-based elastomer may be 30,000 to 200,000, 50,000 to 150,000, or 75,000 to 125,000, from the viewpoint of coating film characteristics.

The content of the component (A) (elastomer) may be 50% to 90% by mass with respect to the total amount of the component (A) and the component (B) (polymerizable compound). When the content of the component (A) is 50% by mass or more, particularly satisfactory flexibility is likely to be obtained. When the content of the component (A) is 90% by mass or less, the elastomer may be easily entwined by the polymerizable compound at the time of curing, and therefore, the resin composition can be cured particularly easily. From the same point of view, the content of the component (A) may be 60% to 85% by mass, or 70% to 80% by mass.

The polymerizable compound of the component (B) is not particularly limited as long as the compound is a compound that is polymerized by heating or irradiation with ultraviolet radiation or the like. However, from the viewpoints selectivity and easy availability of the material, for example, the polymerizable compound may also be a compound having a polymerizable substituent such as an ethylenically unsaturated group.

Specific examples of the polymerizable compound include a (meth)acrylate, a vinylidene halide, a vinyl ether, a vinyl ester, a vinylpyridine, a vinylamide, and an arylated vinyl. From the viewpoint of transparency, the polymerizable compound may include a (meth)acrylate and/or an arylated vinyl. The (meth)acrylate may be a monofunctional, bifunctional, or polyfunctional (trifunctional or higher-functional) compound; however, in order to easily obtain sufficient curability, the (meth)acrylate may be bifunctional or polyfunctional (meth)acrylate.

Examples of a monofunctional (meth)acrylate include aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono-(2-(meth)acryloyloxyethyl) succinate; alicyclic (meth)acrylates such as cyclopentyl (meth)acrylate, cyclohexyl (meth)acrylate, cyclopentyl (meth)acrylate, dicyclopentanyl (meth)acrylate, dicyclopentenyl (meth)acrylate, isobornyl (meth)acrylate, mono-(2-(meth)acryloyloxyethyl) tetrahydrophthalate, and mono-(2-(meth)acryloyloxyethyl) hexahydrophthalate; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonylphenoxy polyethylene glycol (meth)acrylate, phenoxy polypropylene glycol (meth)acrylate, 2-hydroxy-3-phenoxypropyl (meth)acrylate, 2-hydoxy-3-(o-phenylphenoxy)propyl (meth)acrylate, 2-hydroxy-3-(1-naphthoxy)propyl (meth)acrylate, and 2-hydroxy-3-(2- naphthoxy)propyl (meth)acrylate; heterocyclic (meth) acrylates such as 2-tetrahydrofurfuryl (meth)acrylate, N-(meth)acryloyloxyethyl hexahydrophthalimide, and 2-(meth)acryloyloxyethyl-N-carbazole; and caprolactone modification products thereof. Among these, aliphatic (meth)acrylates and aromatic (meth)acrylates are particularly excellent from the viewpoints of compatibility with thermoplastic polyurethanes, transparency, and heat resistance.

Examples of a bifunctional (meth)acrylate include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di0(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; alicyclic (meth)acrylates such as cyclohexanedimethanol (meth)acrylate, ethoxylated cyclohexanedimethanol (meth)acrylate, propoxylated cyclohexanedimethanol (meth)acrylate, ethoxylated propoxylated cyclohexanedimethanol (meth)acrylate, tricyclodecanedimethanol (meth)acrylate, ethoxylated tricyclodecanedimethanol (meth)acrylate, propoxylated tricyclodecanedimethanol (meth)acrylate, ethoxylated propoxylated tricyclodecanedimethanol (meth)acrylate, ethoxylated hydrogenated bisphenol A di(meth)acrylate, propoxylated hydrogenated bisphenol A di(meth)acrylate, ethoxylated propoxylated hydrogenated bisphenol A di(meth)acrylate, ethoxylated hydrogenated bisphenol F di(meth)acrylate, propoxylated hydrogenated bisphenol F di(meth)acrylate, and ethoxylated propoxylated hydrogenated bisphenol F di(meth)acrylate; aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene type di(meth)acrylate, propoxylated fluorene type di(meth)acrylate, and ethoxylated propoxylated fluorene type di(meth)acrylate; heterocyclic (meth)acrylates such as ethoxylated isocyanuric acid di(meth)acrylate, propoxylated isocyanuric acid di(meth)acrylate, and ethoxylated propoxylated isocyanuric acid di(meth)acrylate; caprolactone modification products thereof; aliphatic epoxy (meth)acrylates such as neopentyl glycol type epoxy(meth)acrylate; alicyclic epoxy(meth)acrylates such as cyclohexanedimethanol type epoxy(meth)acrylate, hydrogenated bisphenol A type epoxy(meth)acrylate, and hydrogenated bisphenol F type epoxy(meth)acrylate; aromatic epoxy(meth)acrylates such as resorcinol type epoxy(meth)acrylate, bisphenol A type epoxy(meth)acrylate, bisphenol F type epoxy(meth)acrylate, bisphenol AF type epoxy(meth)acrylate, and fluorene type epoxy (meth)acrylate. Among these, aliphatic (meth)acrylates and aromatic (meth)acrylates are particularly excellent from the viewpoints of compatibility with thermoplastic polyurethanes, transparency, and heat resistance.

Examples of a polyfunctional (meth)acrylate of trifunctionality or higher-functionality include aliphatic (meth) acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri (meth)acrylate, propoxylated pentaerythritol tri(meth)acrylate, ethoxylated propoxylated pentaerythritol tri(meth) acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylolpropane tetraacrylate, and dipentaerythritol hexa(meth)acrylate; heterocyclic (meth)acrylates such as ethoxylated isocyanuric acid tri(meth)acrylate, propoxylated isocyanuric acid tri (meth)acrylate, and ethoxylated propoxylated isocyanuric acid tri(meth)acrylate; and aromatic epoxy(meth)acrylates such as caprolactone modification products thereof; phenol novolac type epoxy(meth)acrylate and cresol novolac type epoxy(meth)acrylate. Among these, aliphatic (meth)acrylates and aromatic (meth)acrylates are particularly excellent from the viewpoints of compatibility with thermoplastic polyurethanes, transparency, and heat resistance.

These compounds can be used singly or in combination of two or more kinds thereof, and the compounds can also be used in combination with other polymerizable compounds.

The content of the polymerizable compound of the component (B) may be 10% to 50% by mass with respect to the total amount of the component (A) and the component (B). When the content of the component (B) is 10% by mass or more, the polymerizable compound can be cured particularly easily together with the (A) elastomer. When the content of the component (B) is 50% by mass or less, sufficient strength and flexibility of the cured product may be easily obtained. From the same point of view, the content of the component (B) may be 15% to 40% by mass.

The polymerization initiator of the component (C) is not particularly limited as long as it is a compound capable of initiating polymerization as a result of heating or irradiation with ultraviolet radiation or the like. For example, in a case in which a compound having an ethylenically unsaturated group is used as the polymerizable compound of the component (B), the polymerization initiator may be a thermal radical polymerization initiator or a photoradical polymerization initiator. The component (C) may include a photoradical polymerization initiator, in view of having a fast curing rate and being capable of curing at normal temperature.

Examples of the thermal radical polymerization initiator include ketone peroxides such as methyl ethyl ketoneperoxide, cyclohexanone peroxide, and methylcyclohexanone peroxide; peroxy ketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy)cyclohexane, 1,1-bis(t-hexylperoxy)-3,3,5-trimethylcyclohexane; hydroperoxides such as p-menthane hydroperoxide; dialkyl peroxides such as α,α'-bis(t-butylperoxy)diisopropylbenzene, dicumyl peroxide, t-butylcumyl peroxide, and di-t-butyl peroxide; diacyl peroxides such as octanoyl peroxide, lauroyl peroxide, stearyl peroxide, and benzoyl peroxide; peroxycarbonates such as bis(4-t-butyl-cyclohexyl) peroxydicarbonate, di-2-ethoxyethyl peroxydicarbonate, di-2-ethylhexyl peroxydicarbonate, di-3-methoxybutyl peroxycarbonate; peroxy esters such as t-butyl peroxypivalate, t-hexyl peroxypivalate, 1,1,3,3-tetramethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxyisopropyl monocarbonate, t-butyl peroxy-3,5,5-trimethylhexanoate, t-butyl peroxylaurylate, t-butyl peroxyisopropyl monocarbonate, t-butyl peroxy-2-ethylhexyl monocarbonate, t-butyl peroxybenzoate, t-hexyl peroxybenzoate, 2,5-dimethyl-2,5-bis(benzoylperoxy)hexane, t-butyl peroxyacetate; and azo compounds such as 2,2'-azobisisobutyronitrile, 2,2'-azobis(2,4-dimethylvaleronitrile), and 2,2'-azobis(4-methoxy-2'-dimethylvaleronitrile). Among these, diacyl peroxides, peroxy esters, and azo compounds are particularly excellent from the viewpoints of curability, transparency, and heat resistance.

Examples of the photoradical polymerization initiator include benzoin ketals such as 2,2-dimethoxy-1,2-diphenylethan-1-one; a-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; α-amino ketones such as 2-benzyl-2-dimethylamino-1-(4-morpholinophenyl)-butan-1-one and 1,2-methyl-1-[4-(methylthio)phenyl]-2-morpholinopropan-1-one; oxime esters such as 1-[(4-phenylthio)phenyl]-1,2-octadione-2-(benzoyl)oxime; phosphine oxides such as bis (2,4,6-trimethylbenzoyl)phenylphosphine oxide, bis(2,6-dimethoxybenzoyl)-2,4,4-trimethylpentylphosphine oxide, and 2,4,6-trimethylbenzoyl diphenylphosphine oxide; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; benzophenone compounds such as benzophenone, N,N'-tetramethyl-4,4'-diaminobenzophenone, N,N'-tetraethyl-4,4'-diaminobenzophenone, and 4-methoxy-4'-dimethylaminobenzophenone; quinone compounds such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ethers such as benzoin methyl ether, benzoin ethyl ether, and benzoin phenyl ether; benzoin compounds such as benzoin, methylbenzoin, and ethylbenzoin; benzyl compounds such as benzyl dimethyl ketal; acridine compounds such as 9-phenylacridine and 1,7-bis(9,9'-acridinylheptane); N-phenylglycine, and coumarin.

In regard to the 2,4,5-triarylimidazole dimer, the substituents for the aryl groups at the two triarylimidazole sites may be given identical and symmetric compounds, or may be given different and asymmetric compounds. A thioxanthone compound and a tertiary amine may also be used in combination, such as the combination of diethylthioxanthone and dimethylaminobenzoic acid.

Among these, α-hydroxy ketones and phosphine oxides are particularly excellent from the viewpoints of curability, transparency and heat resistance.

These thermal and photoradical polymerization initiators can be used singly, or in combination of two or more kinds thereof. Furthermore, these polymerization initiators can also be used in combination with an appropriate sensitizer.

The content of the polymerization initiator of the component (C) may be 0.1 to 10 parts by mass with respect to 100 parts by mass of the total amount of the component (A) and the component (B). When the content of the component (C) is 0.1 parts by mass or more, there is a tendency that the resin composition may be cured easily and sufficiently. When the content of the component (C) is 10 parts by mass or less, there is a tendency that a flexible resin layer having sufficient light transmissibility may be easily formed. From the same point of view, the content of the component (B) may be 0.3 to 7 parts by mass, or 0.5 to 5 parts by mass.

In addition to this, if necessary, so-called additives such as an oxidation inhibitor, a yellowing inhibitor, an ultraviolet absorber, a visible light absorber, a colorant, a plasticizer, a stabilizer, and a filler may also be added to the resin composition to the extent that the effects of the present invention are not substantially impaired.

A resin composition according to an embodiment may be used as a resin varnish after being diluted using an organic solvent. The organic solvent used herein is not particularly limited as long as the organic solvent can dissolve the resin composition. Examples of the organic solvent include aromatic hydrocarbons such as toluene, xylene, mesitylene, cumene, and p-cymene; cyclic ethers such as tetrahydrofuran and 1,4-dioxane; ketones such as acetone, methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methylpyrrolidone. Among these, toluene and N,N-dimethylacetamide can be selected from the viewpoints of solubility and the boiling point. These organic solvents can be used singly or in combination of two or more kinds thereof. The solid content concentration in the resin varnish may be 20% to 80% by mass.

The elastic modulus of a flexible resin layer formed by curing a resin composition including (A) a thermoplastic polyurethane, (B) a polymerizable compound and (C) a polymerization initiator, may be from 0.1 MPa to 1,000 MPa. When the elastic modulus is from 0.1 MPa to 1,000 MPa, handleability as a film and flexibility can be obtained. From this point of view, the elastic modulus may be from 0.3 MPa to 100 MPa, or from 0.5 MPa to 50 MPa.

The elongation at break of the flexible resin layer may be 100% or higher. When the elongation at break is 100% or higher, superior elasticity can be obtained. From the same point of view, the elongation at break may be 300% or higher, or may be 500% or higher.

Figure 4:
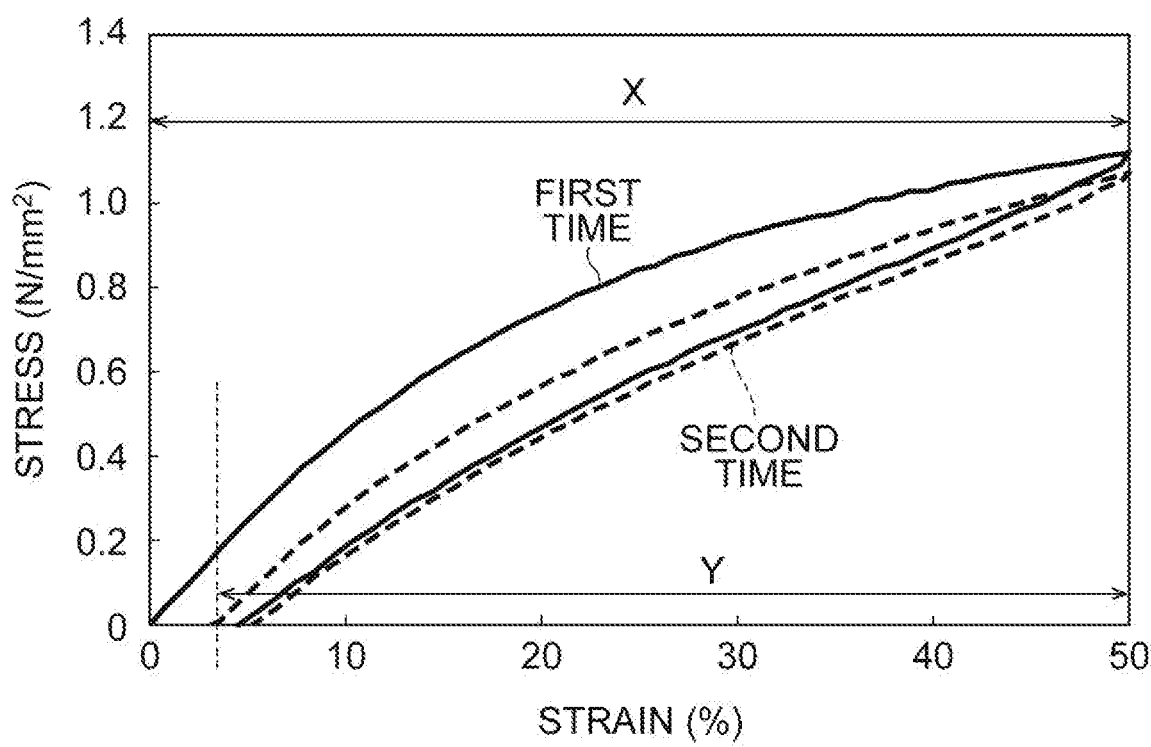
FIG. 4 is a stress-strain curve showing an example for measuring the recovery factor.

In a tensile test using a measurement sample of a flexible resin layer, when the strain (amount of displacement) added to the first tensile test is designated as X; the position at which load begins to be applied when the measurement sample is subsequently returned to the initial position and the tensile test is performed again is designated as Y; and R calculated by the formula: R=Y/X is defined as the recovery factor, this recovery factor may be 80% or higher. The recovery factor can be measured by normalizing X to be 50%. FIG. 4 is a stress-strain curve illustrating an example for measuring the recovery factor. When the recovery factor is 80% or higher, the resistance to repeated use can be further enhanced. From the same point of view, the recovery factor may be 85% or higher, or may be 90% or higher.

The flexible resin layer formed from a resin composition may have any one or more characteristics selected from a total light transmittance of 80% or higher, a Yellowness Index of 5.0 or less, and a haze of 5.0% or lower. These can be measured using, for example, a spectral haze meter (spectral haze meter "SH7000" manufactured by Nippon Denshoku Industries Co., Ltd.). When these characteristics are in the above-described ranges, sufficient transparency may be easily obtained. From the same point of view, characteristics including a total light transmittance of 85% or higher, a Yellowness Index of 4.0 or less, and a haze of 4.0% or lower are desirable, and characteristics including a total light transmittance of 90% or higher, a Yellowness Index of 3.0 or less, and a haze of 3.0% or lower are also acceptable.

A resin film according to an embodiment comprises the resin composition described above. In other words, the resin film can include (A) an elastomer, (B) a polymerizable compound, and (C) a polymerization initiator. This resin film can be easily produced by, for example, applying a resin varnish including (A) an elastomer, (B) a polymerizable compound, (C) a polymerization initiator, and an organic solvent that dissolves these components on a base material film, and removing the solvent from the coating film.

There are no particular limitations on the base material film, and examples thereof include films of a polyester such as polyethylene terephthalate (PET), polybutylene terephthalate, or polyethylene naphthalate; a polyolefin such as polyethylene or polypropylene; a polycarbonate, a polyamide, a polyimide, a polyamideimide, a polyether imide, a polyether sulfide, a polyether sulfone, a polyether ketone, a polyphenylene ether, a polyphenylene sulfide, a polyarylate, a polysulfone, and a liquid crystal polymer. Among these, from the viewpoints of flexibility and toughness, the base material film may be a film of polyethylene terephthalate, polybutylene terephthalate, polyethylene naphthalate, polypropylene, a polycarbonate, a polyamide, a polyimide, a polyamideimide, a polyphenylene ether, a polyphenylene sulfide, a polyallylate, or a polysulfone.

The thickness of the base material film may be varied as appropriate according to the intended flexibility; however, the thickness may be 3 to 250 μm. When the thickness of the base material film is 3 μm or more, sufficient film strength is likely to be obtained, and when the thickness of the base material film is 250 μm or less, sufficient flexibility is likely to be obtained. From the same point of view, the thickness of the base material film may be 5 to 200 μm, or 7 to 150 μm. From the viewpoint of enhancing detachability from the resin film, the surface of the base material film may be subjected to a release treatment using a silicone-based compound, a fluorine-containing compound or the like.

If necessary, a protective film may be attached onto the resin film, and a laminated film having a three-layer structure composed of a base material film, a resin film, and a protective film may be formed. Examples of the protective film include films of a polyester such as butylene terephthalate or polyethylene naphthalate; and a polyolefin such as polyethylene or polypropylene. Among these, from the viewpoints of flexibility and toughness, the protective film may be a film of a polyester such as polyethylene terephthalate; or a polyolefin such as polyethylene or polypropylene. From the viewpoint of enhancing detachability from the resin film, the surface of the protective film may be subjected to a release treatment using a silicone-based compound, a fluorine-containing compound or the like.

The thickness of the protective film may be varied as appropriate according to the intended flexibility; however, the thickness may be 10 to 250 μm. When the thickness of the protective film is 10 μm or more, sufficient film strength may be easily obtained, and when the thickness of the protective film is 250 μm or less, sufficient flexibility may be easily obtained. From the same point of view, the thickness of the protective film may be 15 to 200 μm, or may be 20 to 150 μm.

The thickness after drying of the resin film is not particularly limited; however, the thickness may be 5 to 1,000 μm. When the thickness of the resin film is 5 μm or more, there is a tendency that the resin film or a cured product thereof (flexible resin layer) may easily acquire sufficient strength. When the thickness of the resin film is 1,000 μm or less, the amount of residual solvent in the resin film can be reduced easily and sufficiently by drying. If the amount of residual solvent is small, when a cured product of the resin film is heated, foaming occurs to a reduced extent.

The resin film can be easily stored by, for example, winding into a roll form. Alternatively, a rolled film may be cut into a suitable size and stored in a sheet-like state.

A resin composition according to an embodiment can be used as an encapsulant for forming a flexible encapsulating member for a wearable device. Similarly, a resin film according to an embodiment can be used as a resin encapsulating film for forming a flexible encapsulating member for a wearable device.

EXAMPLES

Hereinafter, Examples of the present invention will be described more specifically; however, the present invention is not intended to be limited to these Examples.

Example 1

Preparation of Resin Varnish VU1

80 parts by mass of a polyether-based thermoplastic polyurethane ("ELASTON ET385A" of BASF Japan, Ltd.) as component (A), 20 parts by mass of an ethylene oxide-modified bisphenol A type dimethacrylate ("FANCRYL FA-321M" manufactured by Hitachi Chemical Co., Ltd.) as component (B), 1.5 parts by mass of bis(2,4,6-trimethylbenzoyl)phenylphosphine oxide ("IRGACURE 819" manufactured by BASF SE) as component (C), and 125 parts by mass of toluene as a solvent were mixed, while the mixture was stirred. Thus, a resin varnish VU1 was obtained.

Production of Resin Film VU1

A surface release-treated PET film ("PUREX A31" manufactured by Teijin DuPont Films Japan, Ltd., thickness 25 μm) was prepared as a base material film. The resin varnish VU1 was applied on the release-treated surface of this PET film using a knife coater ("SNC-350" manufactured by Yasui Seiki, Inc.). Next, the resin varnish was dried for 20 minutes at 100° C. in a dryer ("MSO-80TPS" manufactured by Futaba Co., Ltd.), and thereby a resin film was formed. A surface release-treated PET film that was identical to the base material film was attached to the resin film thus formed such that the release-treated surface would come to the resin film side, and thereby a laminated film FU1 was obtained. At this time, the thickness of the resin film can be arbitrarily adjusted by regulating the gap of the coating machine. In the present Example, the film thickness of the resin film after curing was adjusted to 100 μm.

Examples 2 to 5 and Comparative Examples 1 and 2

Resin varnishes VU2 to VU6 were prepared in the same manner as in Example 1 according to the mixing ratios indicated in Table 1, and thus resin films FU2 to FU6 were produced. As Comparative Example 2, a sheet-like film FS1 (thickness 200 μm) made of a silicone rubber was prepared.

Measurement of Elastic Modulus and Elongation Ratio

Each resin film was cured by being irradiated with ultraviolet radiation (wavelength 365 nm) at a dose of 5000 mJ/cm$^2$ using an ultraviolet exposure machine ("ML-320FSAT" manufactured by Mikasa Co., Ltd.). Thereby, a flexible resin layer was formed. Next, the base material film was removed, the laminated film was cut into a size of 40 mm in length and 10 mm in width, and the protective film was removed. Thus, a sample for measurement of the flexible resin layer was obtained. A stress-strain curve for the sample for measurement was measured using an autograph ("EZ-S" of Shimadzu Corp.), and the elastic modulus and the elongation ratio were determined from the stress-strain curve. The distance between chucks at the time of measurement was set to 20 mm, and the tensile rate was set to 50 mm/min. Also, here, a value under a load of 0.5 to 1.0 N was measured as the elastic modulus, and a value obtained when the sample was broken (elongation at break) was measured as the elongation ratio.

Measurement of Recovery Factor

A flexible resin layer was formed on each resin film by irradiating the resin film with ultraviolet radiation (wavelength 365 nm) at a dose of 5000 mJ/cm$^2$ using an ultraviolet exposure machine ("ML-320FSAT" of Mikasa Co., Ltd.) and thereby curing the resin film. Thereafter, the base material film was removed, the laminated film was cut into a size of 70 mm in length and 5 mm in width, and the protective film was removed. Thus, a sample for measurement was obtained. The recovery factor of the sample for measurement was measured using a microforce testing machine ("INSTRON 5948" of Illinois Tool Works, Inc.).

The recovery factor refers to R that is calculated by the formula: $R=Y/X$ when the amount of displacement (strain) added to the first tensile test is designated as X; and the position (amount of displacement) at which load begins to be applied to the measurement sample when the measurement sample is returned to the initial position after the first tensile test and the tensile test is performed again, is designated as Y. In this measurement, the initial length (distance between chucks) was set to 50 mm, and X was set to 25 mm (strain 50%).

Measurement of Total Light Transmittance, YI, and Haze

The protective film was removed from the laminated film, and the resin film was laminated on a slide glass ("S1111" of Matsunami Glass Ind., Ltd.) using a vacuum pressing type laminator ("V130" of Nichigo Morton Co., Ltd.), under the conditions of a pressure of 0.5 MPa, a temperature of 60° C., and a pressing time of 60 seconds. The resin film thus laminated was irradiated with ultraviolet radiation (wavelength 365 nm) using the ultraviolet exposure machine described above at a dose of 5000 mJ/cm$^2$, and thereby a flexible resin layer was formed. Thereafter, the base material film was peeled off, and the total light transmittance, YI, and haze of the flexible resin layer were measured using a spectral haze meter ("SH7000" of Nippon Denshoku Industries Co., Ltd.).

Evaluation of Level Difference Embedding Properties

A silicon wafer was processed into a size of 10 mm×10 mm with a thickness of 0.1 mm, and a test was performed to find whether this silicon wafer could be embedded by the resin films produced in the Examples and Comparative Examples described above (the thickness was 100 μm in Examples 1 to 5 and Comparative Example 1, and 200 μm in Comparative Example 2). The resin film was laminated on the silicon wafer using the vacuum pressing type laminator under the conditions of a pressure of 0.8 MPa, a temperature of 90° C., and a pressing time of 60 seconds, and the state of embedment at that time was observed. A case in which a level difference having a height of 100 μm could be embedded without any voids was evaluated as A, and a case in which the level difference could not be embedded was evaluated as C.

The evaluation results of Examples 1 to 5 and Comparative Examples 1 and 2 are presented in Table 1.

TABLE 1

| | Item | | Unit | Ex. 1 | Ex. 2 | Ex. 3 | Ex. 4 | Ex. 5 | Comp. Ex. 1 | Comp. Ex. 2 |
|---|---|---|---|---|---|---|---|---|---|---|
| | Number | | — | VU3 (FU3) | VU2 (FU2) | VU3 (FU3) | VU4 (FU4) | VU5 (FU5) | VU6 (FU6) | FS1 |
| Composition | Component (A) (elastomer) | ELASTON ET385[1] | Parts by mass | 80 | — | — | 90 | 60 | — | — |
| | | ELASTON C85T[2] | | — | 80 | — | — | — | — | — |
| | | MIRACTRAN XN-2001[3] | | — | — | 80 | — | — | — | — |
| | | KAYAFLEX BPAM-155[4] | | — | — | — | — | — | 80 | — |
| | | SR-50[5] | | — | — | — | — | — | — | 100 |
| | Component (B) (polymerizable monomer) | FA-321M[6] | | 20 | 20 | 20 | 10 | 40 | 20 | — |
| | Component (C) (polymerization initiator) | IRGACURE 819[7] | | 1.5 | 1.5 | 1.5 | 1.5 | 1.5 | 1.5 | — |
| | Solvent | Toluene | | 125 | 125 | 125 | 125 | 125 | 125 | — |
| Configuration characteristics | | Elastic modulus | MPa | 13 | 13 | 22 | 20 | 40 | 618 | 1.1 |
| | | Elongation ratio | % | 623 | 671 | 796 | 810 | 620 | 161 | 420 |
| | | Recovery factor | % | 94 | 92 | 94 | 92 | 90 | 58 | 98 |
| Optical characteristics | | Total light transmittance | % | 91 | 91 | 92 | 92 | 92 | 74 | 90 |
| | | YI | — | 1.3 | 2.1 | 0.6 | 1.3 | 1.8 | 14.7 | 2.5 |
| | | Haze | % | 1.8 | 8.4 | 1.1 | 2.0 | 3.5 | 97.1 | 33.5 |
| Level difference embedding properties | | | — | A | A | A | A | A | A | C |

[1] Polyether-based thermoplastic polyurethane, "ELASTON ET385A" of BASF Japan, Ltd., weight average molecular weight: 1.3 × 10$^5$
[2] Polyester-based thermoplastic polyurethane, "ELASTON C85A" of BASF Japan, Ltd., weight average molecular weight: 1.2 × 10$^5$
[3] Non-yellowing type thermoplastic polyurethane, "MIRACTRAN XN-2001" of Tosoh Corp., weight average molecular weight: 8.1 × 10$^4$
[4] Rubber-modified polyamide, "KAYAFLEX BPAM-155" of Nippon Kayaku Co., Ltd., weight average molecular weight: 3.1 × 10$^4$
[5] Silicone rubber sheet, "SR-50" of Tigers Polymer Corp.
[6] Ethylene oxide-modified bisphenol A type dimethacrylate ("FANCRYL FA-321M" of Hitachi Chemical Co., Ltd.)
[7] Bis(2,4,6-trimethylbenzoyl)phenylphosphine oxide ("IRGACURE 819" of BASF Japan, Ltd.)

It is understood that the flexible resin layers formed using the resin compositions of Examples 1 to 5, which include thermoplastic polyurethane, have low elastic moduli and high flexibility, and also have excellent transparency and level difference embedding properties. On the other hand, it is understood that the flexible resin layers formed using the resin compositions of Comparative Examples 1 and 2, which include elastomers other than thermoplastic polyurethane, have poor flexibility, transparency or level difference embedding properties.

Example 6

Preparation of Resin Varnish VA1

80 parts by mass of a styrene-isoprene copolymerized polymer ("KRATON D1117" of Kraton Polymer Japan, Ltd.) as component (A), 20 parts by mass of butanediol diacrylate ("FANCRYL FA-124AS" manufactured by Hitachi Chemical Co., Ltd.) as component (B), 1.5 parts by mass of bis(2,4,6-trimethylbenzoyl)phenylphosphine oxide ("IRGACURE 819" manufactured by BASF SE) as component (C), and 125 parts by mass of toluene as a solvent were mixed while the mixture was stirred. Thus, a resin varnish VA1 was obtained.

Production of Resin Film FA1

A surface release-treated PET film ("PUREX A31" manufactured by DuPont Teijin Films, Ltd., thickness 25 μm) was prepared as a base material film. The resin varnish VA1 was applied on the release-treated surface of this PET film using a knife coater ("SNC-350" manufactured by Yasui Seiki, Inc.). Next, the resin varnish VA1 was dried for 20 minutes at 100° C. in a dryer ("MSO-80TPS" manufactured by Futaba Co., Ltd.), and thereby a resin film was formed. A surface release-treated PET film that was identical with the base material film was attached as a protective film to the resin film thus formed, such that the release-treated surface would come to the resin film side, and thereby a laminated film FA1 was obtained. The thickness of the resin film can be arbitrarily adjusted by regulating the gap of the coating machine. In this Example, the film thickness of the resin film after curing was adjusted to 100 μm.

Examples 7 to 12 and Comparative Examples 1 and 2

Resin varnishes VA2 to VA8 were prepared in the same manner as in Example 6 according to the mixing ratios indicated in Table 2, and laminated films FA2 to FA8 were produced. As Comparative Example 2, a sheet-like film made of a silicone rubber, FS1 (thickness 200 μm), was prepared.

Various resin films were evaluated in the same manner as in Examples 1 to 5. The evaluation results of Examples 7 to 13 and Comparative Examples 1 and 2 are presented in Table 1.

TABLE 2

| Item | | | Unit | Ex. 7 | Ex. 8 | Ex. 9 | Ex. 10 | Ex. 11 | Ex. 12 | Ex. 13 | Comp. Ex. 1 | Comp. Ex. 2 |
|---|---|---|---|---|---|---|---|---|---|---|---|---|
| | Number | | — | VA1 (FA1) | VA2 (FA2) | VA3 (FA3) | VA4 (FA4) | VA5 (FA5) | VA6 (FA6) | VA7 (FA7) | VA8 (FA8) | FS1 |
| Composition | Component (A) (elastomer) | KRATON D1117[1] | Parts by mass | 80 | 80 | — | — | — | — | — | — | — |
| | | DYNARON 2324P[2] | | — | — | 80 | 80 | 80 | 90 | 60 | — | — |
| | | KAYAFLEX BPAM-155[3] | | — | — | — | — | — | — | — | 80 | — |
| | | SR-50[4] | | — | — | — | — | — | — | — | — | 100 |
| | Component (B) (polymerizable monomer) | FA-124AS[5] | | — | — | 20 | — | — | — | — | — | — |
| | | FA-126AS[6] | | 20 | — | — | 20 | — | 10 | 40 | 20 | — |
| | | FA-129AS[7] | | — | — | — | — | 20 | — | — | — | — |
| | | FA-321M[8] | | — | 20 | — | — | — | — | 20 | — | — |
| | Component (C) (polymerization initiator) | IRGACURE 819[9] | | 1.5 | 1.5 | 1.5 | 1.5 | 1.5 | 1.5 | 1.5 | 1.5 | — |
| | Solvent | Toluene | | 125 | 125 | 125 | 125 | 125 | 125 | 125 | 125 | — |
| Configuration characteristics | | Elastic modulus | MPa | 2.1 | 0.5 | 0.8 | 1.1 | 2.4 | 0.8 | 90 | 618 | 1.1 |
| | | Elongation ratio | % | 450 | 682 | 954 | 757 | 730 | 746 | 444 | 161 | 420 |
| | | Recovery factor | % | 92 | 92 | 94 | 94 | 94 | 94 | 90 | 58 | 98 |
| Optical characteristics | | Total light transmittance | % | 91 | 91 | 92 | 91 | 92 | 92 | 91 | 74 | 90 |
| | | YI | — | 0.5 | 0.5 | 1.1 | 1.0 | 0.6 | 1.0 | 1.3 | 14.7 | 2.5 |
| | | Haze | % | 3.3 | 3.0 | 0.6 | 1.6 | 1.8 | 4.1 | 5.0 | 97.1 | 33.5 |
| | Level difference embedding properties | | — | A | A | A | A | A | A | A | A | C |

[1]Styrene-isoprene copolymerized polymer, "KRATON D1117" of Kraton Polymer Japan, Ltd., weight average molecular weight: $1.6 \times 10^5$
[2]Hydrogenated type styrene-butadiene rubber, "DYNARON 2324P" of JSR Corp., weight average molecular weight: $1.0 \times 10^5$
[3]Rubber-modified polyamide "KAYAFLEX BPAM-155" of Nippon Kayaku Co., Ltd., weight average molecular weight: $3.1 \times 10^4$
[4]Silicone rubber sheet, "SR-50" of Tigers Polymer Corp.
[5]Butanediol diacrylate ("FANCRYL FA-124AS" of Hitachi Chemical Co., Ltd.)
[6]Hexanediol diacrylate ("FANCRYL FA-126AS" of Hitachi Chemical Co., Ltd.)
[7]Nonanediol diacrylate ("FANCRYL FA-129AS" of Hitachi Chemical Co., Ltd.)
[8]Ethylene oxide-modified bisphenol A type dimethacrylate ("FANCRYL FA-321M" of Hitachi Chemical Co., Ltd.)
[9]Bis(2,4,6-trimethylbenzoyl)phenylphosphine oxide ("IRGACURE 819" of BASF Japan, Ltd.)

It is understood that the flexible resin layers formed using the resin compositions of Examples 7 to 13, which include styrene-based elastomers, have low elastic moduli and high flexibility, and have excellent transparency and level difference embedding properties. On the other hand, it is understood that the flexible resin layers formed using the resin compositions of Comparative Examples 1 and 2, which include elastomers other than styrene-based elastomers, have poor flexibility, transparency or level difference embedding properties.

INDUSTRIAL APPLICABILITY

The flexible resin composition and resin film of the present invention have excellent flexibility, transparency, and level difference embedding properties, and these can be used suitably as encapsulating layers for protective circuit boards of wearable devices.

REFERENCE SIGNS LIST

1: FLEXIBLE SUBSTRATE
2: CIRCUIT COMPONENT
3: FLEXIBLE RESIN LAYER (FLEXIBLE MEMBER)
100: SEMICONDUCTOR DEVICE

The invention claimed is:

1. A resin film comprising a resin composition for forming a flexible resin layer, the resin composition comprising:
 (A) an elastomer including a hydrogenated styrene-based elastomer;
 (B) a polymerizable compound; and
 (C) a polymerization initiator,
 wherein the polymerizable compound includes at least one aliphatic (meth)acrylate selected from propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, and ethoxylated 2-methyl-1,3-propanediol di(meth)acrylate, and
 the content of the (A) elastomer is 50% to 85% by mass with respect to the total amount of the (A) elastomer and the (B) polymerizable compound.

2. The resin film according to claim 1, wherein the content of the (A) elastomer is 50% to 80% by mass with respect to the total amount of the (A) elastomer and the (B) polymerizable compound.

3. The resin film according to claim 1, wherein the (B) polymerizable compound includes 1,9-nonanediol di(meth)acrylate.

4. The resin film according to claim 1, wherein the flexible resin layer formed from the resin composition has a total light transmittance of 80% or higher.

5. The resin film according to claim 1, wherein the flexible resin layer formed from the resin composition has a Yellowness Index of 5.0 or less.

6. The resin film according to claim 1, wherein the flexible resin layer formed from the resin composition has a haze of 5.0% or lower.

7. A laminated film comprising:
a base material film;
a resin film according to claim 1 formed on the base material film; and
a protective film attached onto the resin film.

* * * * *